US009076975B2

(12) United States Patent
Wu et al.

(10) Patent No.: US 9,076,975 B2
(45) Date of Patent: Jul. 7, 2015

(54) DIELECTRIC COMPOSITION FOR THIN-FILM TRANSISTORS

(75) Inventors: Yiliang Wu, Oakville (CA); Ping Liu, Mississauga (CA); Anthony James Wigglesworth, Oakville (CA); Nan-Xing Hu, Oakville (CA)

(73) Assignee: Xerox Corporation, Norwalk, CT (US)

( * ) Notice: Subject to any disclaimer, the term of this patent is extended or adjusted under 35 U.S.C. 154(b) by 392 days.

(21) Appl. No.: 12/768,038

(22) Filed: Apr. 27, 2010

(65) Prior Publication Data
US 2011/0260283 A1    Oct. 27, 2011

(51) Int. Cl.
*H01L 21/31* (2006.01)
*H01L 51/05* (2006.01)
*H01L 21/268* (2006.01)
*H01L 51/00* (2006.01)
*C08K 5/00* (2006.01)

(52) U.S. Cl.
CPC ............. *H01L 51/052* (2013.01); *H01L 21/268* (2013.01); *H01L 51/0003* (2013.01); *H01L 51/0036* (2013.01); *H01L 51/0537* (2013.01); *H01L 51/0545* (2013.01); *C08K 5/0041* (2013.01); *C08K 5/0091* (2013.01)

(58) Field of Classification Search
USPC .......................................................... 257/506
See application file for complete search history.

(56) References Cited

U.S. PATENT DOCUMENTS

| 7,164,190 | B2* | 1/2007 | Kobashi et al. ............... 257/642 |
| 7,573,063 | B1 | 8/2009 | Liu et al. |
| 7,652,339 | B2 | 1/2010 | Wu et al. |
| 2001/0009129 | A1* | 7/2001 | Kunita et al. ................. 101/453 |
| 2005/0244662 | A1* | 11/2005 | Horn et al. .................... 428/469 |
| 2006/0231829 | A1* | 10/2006 | Wu et al. ......................... 257/40 |
| 2006/0231908 | A1 | 10/2006 | Liu et al. |
| 2007/0012950 | A1 | 1/2007 | Cain et al. |
| 2007/0085113 | A1 | 4/2007 | Wu et al. |
| 2008/0237581 | A1* | 10/2008 | Wu et al. ......................... 257/40 |
| 2008/0242112 | A1 | 10/2008 | Wu et al. |
| 2009/0234056 | A1 | 9/2009 | Wu et al. |
| 2009/0256138 | A1 | 10/2009 | Wu et al. |
| 2010/0038714 | A1 | 2/2010 | Wu et al. |
| 2011/0001190 | A1* | 1/2011 | Ide et al. ........................ 257/347 |

FOREIGN PATENT DOCUMENTS

DE    602004006283 T2    12/2007
WO    2005022664 A2    3/2005

OTHER PUBLICATIONS

German Search Report dated Dec. 20, 2011.

* cited by examiner

*Primary Examiner* — Fernando L Toledo
*Assistant Examiner* — Lawrence-Linh T Nguyen
(74) *Attorney, Agent, or Firm* — Fay Sharpe LLP

(57) ABSTRACT

An electronic device, such as a thin-film transistor, includes a substrate and a dielectric layer formed from a dielectric composition. The dielectric composition includes a dielectric material, a crosslinking agent, and an infrared absorbing agent. In particular embodiments, the dielectric material comprises a lower-k dielectric material and a higher-k dielectric polymer. When deposited, the lower-k dielectric material and the higher-k dielectric material form separate phases. The infrared absorbing agent allows the dielectric composition to attain a temperature that is significantly greater than the temperature attained by the substrate during curing. This difference in temperature allows the dielectric layer to be cured at relatively high temperatures and/or shorter time periods, permitting the selection of lower-cost substrate materials that would otherwise be deformed by the curing of the dielectric layer.

4 Claims, 2 Drawing Sheets

DIELECTRIC COMPOSITION FOR THIN-FILM TRANSISTORS

BACKGROUND

The present disclosure relates, in various embodiments, to thin-film transistors (TFTs) and/or other electronic devices comprising a gate dielectric layer. The gate dielectric layer is formed from a dielectric composition as described herein that contains an infrared (IR) absorber or IR absorbing agent. This allows the dielectric composition to be selectively cured while its substrate remains at a relatively lower temperature, preventing deformation of the substrate.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

There is interest in organic thin-film transistors (OTFTs) for applications such as radio frequency identification (RFID) tags and backplane switching circuits for displays, such as signage, readers, and liquid crystal displays, where high switching speeds and/or high density are not essential. OTFTs may be made using low-cost solution or liquid fabrication techniques. They also have attractive mechanical properties such as being physically compact, lightweight, and flexible.

Recently, there has been an increased interest in organic thin-film transistors which can potentially be fabricated using solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin-film transistor circuits for electronic devices. To enable the use of these solution-based processes in fabricating thin-film transistor circuits, solution processable materials are therefore required.

In this regard, gate dielectric layers may be formed by these solution-based processes. However, the gate dielectric layer so formed should be free of pinholes and possess low surface roughness (or high surface smoothness), low leakage current, a high dielectric constant, a high breakdown voltage, adhere well to the gate electrode, be stable in solution at room temperature, and offer other functionality. It should also be compatible with semiconductor materials because the interface between the dielectric layer and the organic semiconductor layer critically affects the performance of the TFT.

Roll-to-roll manufacturing refers to the process, still somewhat in development, of creating electronic devices on a roll of flexible plastic or metal foil, similar to the gravure, offset, and flexographic printing processes used with paper. It is contemplated that large circuits made with thin-film transistors and other devices can be easily patterned onto these large substrates, which can be up to a few metres wide and 50 km long. This type of manufacturing would allow for large-scale low-cost devices, especially when compared to normal semiconductor manufacturing processes that use photolithography techniques.

Low temperatures and increased speed of processing are critical to roll-to-roll manufacturing. In this regard, a solution processable dielectric layer is generally applied as a solution and then cured. The thermal curing generally occurs at a temperature, for example, from about 140° C. to 180° C. and for a period, for example, from 10 minutes to 30 minutes, to ensure optimal performance of the resulting composition. These curing temperatures and times are, in most cases, not compatible with roll-to-roll manufacturing.

It would be desirable to provide a dielectric layer and/or dielectric composition that could be processed at lower temperatures and/or shorter time periods, to allow for manufacture of an electronic device using roll-to-roll manufacturing and other processes.

BRIEF DESCRIPTION

Disclosed in embodiments are electronic devices and processes for making such electronic devices. Generally, the dielectric layer is formed from a dielectric composition as described herein that contains an infrared (IR) absorber or IR absorbing agent. During the curing process, this composition allows the dielectric composition to attain higher temperatures than the other components of the electronic device, particularly the substrate. This reduces deformation of the substrate. The electronic device comprises a dielectric layer, and the dielectric layer comprises a crosslinking dielectric material and an infrared absorber. In embodiments, the electronic devices are thin film transistors, particularly thin film transistors on a flexible substrate, such as low-cost polyethylene terephthalate (PET).

Described in some embodiments is a process for fabricating an electronic device. A dielectric composition is deposited on a substrate. The dielectric composition comprises a dielectric material, a crosslinking agent, and an infrared absorbing agent. The dielectric composition is then exposed to infrared radiation to cure the dielectric composition, forming a dielectric layer on the substrate. A semiconductor layer is then formed on the substrate.

The dielectric material may comprise a lower-k dielectric material and a higher-k dielectric material. The lower-k dielectric material has a dielectric constant of less than 4.0. The higher-k dielectric material has a dielectric constant of 4.0 or higher. In some embodiments, the lower-k dielectric material is a lower-k polymer. In other embodiments, the higher-k dielectric material is a higher-k polymer. In specific embodiments, the lower-k dielectric polymer is poly(methyl silsesquioxane) and the higher-k dielectric polymer is poly (4-vinyl phenol). The exposure to infrared radiation can cause the higher-k dielectric material and the lower-k dielectric material to separate into two phases, the lower-k dielectric material being in a higher concentration than the higher-k dielectric material in the phase of the dielectric layer closest to the semiconductor layer.

The infrared absorbing agent may have an absorption maximum of from about 800 nm to about 1200 nm. The infrared absorbing agent may be present in the amount of from about 0.001 to about 5 wt % of the dielectric layer when cured.

The dielectric composition can be exposed to infrared radiation using a laser. In embodiments, the infrared absorbing agent has an absorption maximum of from about 800 nm to about 1200 nm, and the laser emits at a wavelength which is within 5% of the absorption maximum of the infrared absorbing agent.

The dielectric composition may also be heated with a heat source separate from the device that delivers the infrared radiation. The heat source is in particular embodiments a hotplate or an oven.

The dielectric composition can be exposed to infrared radiation for a period of from about 1 second to about 30 minutes.

During curing, the substrate attains a temperature of from about room temperature to about 160° C., particularly from about room temperature to about 120° C., and the dielectric composition attains a higher temperature than the substrate. The difference between the temperature of the dielectric composition and the temperature of the substrate may be at least 20° C.

Also disclosed in embodiments is a dielectric composition comprising a dielectric material, a crosslinking agent, and an infrared absorbing agent. The dielectric material may comprise a lower-k dielectric material and a higher-k dielectric material, and the dielectric composition may further comprise a liquid in which both the lower-k dielectric material and the higher-k dielectric material are miscible.

The lower-k dielectric material may be poly(methyl silsesquioxane). The higher-k dielectric material may be poly(4-vinyl phenol).

The infrared absorbing agent may have an absorption maximum of from about 800 nm to about 1200 nm, and the infrared absorbing agent may be present in the amount of from about 0.001 to about 5 wt %, based on the weight of the dielectric composition.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
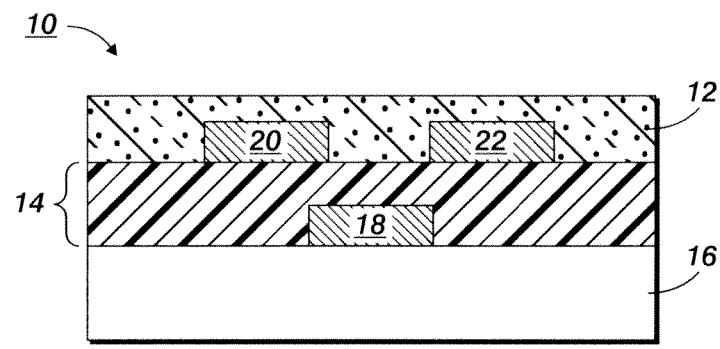
FIG. 1 represents a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "room temperature" refers to a temperature of from 20° C. to 25° C.

FIG. 1 illustrates a bottom-gate bottom-contact TFT configuration according to the present disclosure. The TFT 10 comprises a substrate 16 in contact with the gate electrode 18 and a gate dielectric layer 14. Although here the gate electrode 18 is depicted atop the substrate 16, but could also be located within the substrate. It is important that the gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22.

Figure 2:
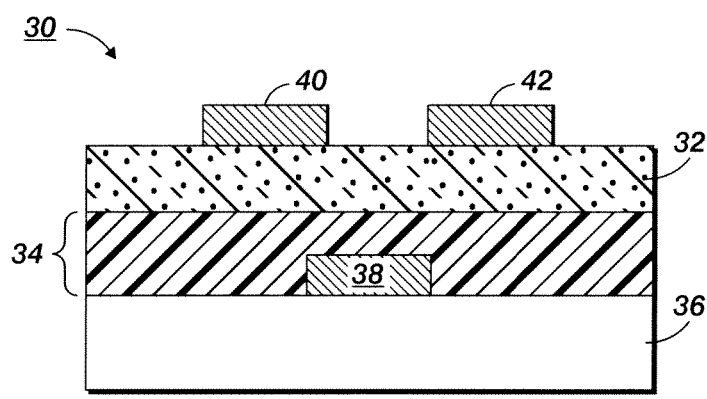
FIG. 2 represents a second embodiment of a TFT according to the present disclosure.

FIG. 2 illustrates another bottom-gate top-contact TFT configuration according to the present disclosure. The TFT 30 comprises a substrate 36 in contact with the gate electrode 38 and a gate dielectric layer 34. The semiconducting layer 32 is placed on top of the gate dielectric layer 34 and separates it from the source and drain electrodes 40 and 42.

Figure 3:
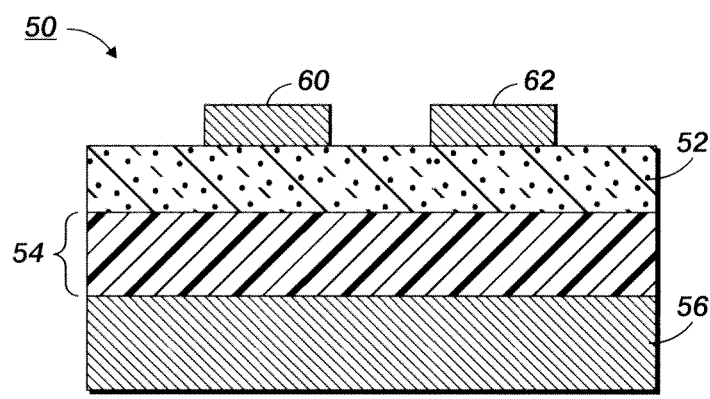
FIG. 3 represents a third embodiment of a TFT according to the present disclosure.

FIG. 3 illustrates a bottom-gate bottom-contact TFT configuration according to the present disclosure. The TFT 50 comprises a substrate 56 which also acts as the gate electrode and is in contact with a gate dielectric layer 54. The source electrode 60, drain electrode 62, and semiconducting layer 52 are located atop the gate dielectric layer 54.

Figure 4:
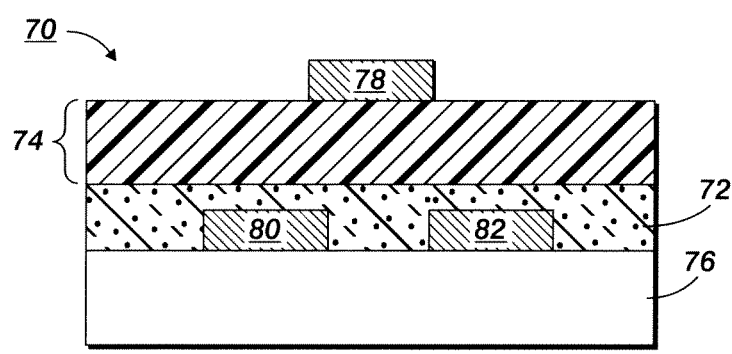
FIG. 4 represents a fourth embodiment of a TFT according to the present disclosure.

FIG. 4 illustrates a top-gate top-contact TFT configuration according to the present disclosure. The TFT 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

Aspects of the present disclosure relate to an electronic device (e.g., a thin-film transistor) comprising a dielectric layer, the dielectric layer comprising an infrared absorber. In some embodiment, the dielectric layer is a single homogeneous layer, or in other words is not composed of multiple phase-separated materials. Further aspects of the present disclosure relate to an electronic device comprising a phase-separated dielectric structure, the dielectric structure comprising an infrared absorber. In the context of a thin-film transistor, the phase-separated dielectric structure can also be referred to as a "gate dielectric." The phase-separated dielectric structure can be used in any suitable electronic device. Besides a thin-film transistor, other types of suitable electronic devices include, for example, an embedded capacitor and an electroluminescent lamp.

In fabricating the present dielectric structure, a dielectric composition is prepared which comprises a dielectric material, a crosslinking agent, an infrared absorbing agent, and optionally a solvent or a liquid. In embodiments, any suitable insulating material can be used as the dielectric material. In further embodiments, the dielectric material is a thermally crosslinkable dielectric material. The term "thermally crosslinkable" refers to the fact that the dielectric material includes functional groups that can react with an additional crosslinking agent or with other functional groups in the dielectric material itself to form a crosslinked network upon heating. The dielectric material can comprise two or more different materials having different dielectric constants. For example, the dielectric material can comprise a lower-k dielectric material and a higher-k dielectric material.

The terms "lower-k dielectric" and "higher-k dielectric" are used to differentiate two types of material (based on the dielectric constant) in the dielectric composition and in the phase-separated dielectric structure.

In embodiments, the lower-k dielectric material is electrically insulating and is compatible or has good compatibility with a semiconductor layer in the device. The terms "compatible" and "compatibility" refer to how well the semiconductor layer performs electrically when it is adjacent to or contacting a surface rich in the lower-k dielectric polymer.

In embodiments, the lower-k dielectric material has a hydrophobic surface and therefore may exhibit satisfactory to excellent compatibility with polythiophene semiconducting polymers. In embodiments, the lower-k dielectric material has a dielectric constant (permittivity) of for instance less than 4.0, or less than about 3.5, or particularly less than about 3.0. The lower-k dielectric material may have non-polar or weak polar groups such as a methyl group, phenylene group, ethylene group, Si—C, Si—O—Si, and the like. In embodiments, the lower-k dielectric material is a polymer. Representative lower-k dielectric polymers include but are not limited to homopolymers such as polystyrene, poly(4-methylstyrene), poly(chlorostyrene), poly($\alpha$-methylstyrene), polysiloxane such as poly(dimethyl siloxane) and poly(diphenyl siloxane), polysilsesquioxane such as poly(ethyl silsesquioxane), poly(methyl silsesquioxane), and poly(phenyl silsesquioxane), polyphenylene, poly(1,3-butadiene), poly(.alpha.-vinylnaphtalene), polypropylene, polyisoprene, polyisobutylene, polyethylene, poly(4-methyl-1-pentene), poly(p-xylene), poly(cyclohexyl methacrylate), poly(propylmethacrylPOSS-co-methylmethacrylate), poly(propylmethacrylPOSS-co-styrene), poly(styrylPOSS-co-styrene), poly(vinyl cinnamate), and the like. In specific embodiments, the lower-k dielectric polymer is a polysilsesquioxane, particularly poly(methyl silsesquioxane). The dielectric constant is measured at room temperature and at 1 kHz frequency. In other embodiments, the lower-k dielectric material is a molecular compound such as a molecular glass compound.

In embodiments, the surface of the lower-k dielectric polymer, when cast as a film, has a low surface energy. To characterize the surface energy, advancing water contact angle can be used. A high contact angle indicates a low surface energy. In embodiments, the contact angle is 80 degrees or higher, or higher than about 90 degrees, or particularly higher than about 95 degrees.

In embodiments, the higher-k dielectric material is electrically insulating and contains polar groups such as a hydroxyl group, amino group, cyano group, nitro group, C=O group, and the like. In embodiments, the higher-k dielectric material has a dielectric constant of 4.0 or more, 5.0 or more, or particularly 6.0 or more. In embodiments, the higher-k dielectric material is a polymer. General types of higher-k dielectric polymers may include polyimide, polyester, polyether, polyacrylate, polyvinyl, polyketone, and polysulfone. Specific representative higher-k dielectric polymers include but are not limited to homopolymers such as poly(4-vinyl phenol) (PVP), poly(vinyl alcohol), and poly(2-hydroxylethyl methacrylate) (PHEMA), cyanoethylated poly(vinyl alcohol) (PVA), cyanoethylated cellulose, poly(vinylidene fluoride) (PVDF), poly(vinyl pyridine), copolymers thereof, and the like. In embodiments, the higher-k dielectric material is PVP, PVA, or PHEMA. In other embodiments, the higher-k dielectric material is a molecular compound such as a molecular glass compound.

In embodiments, the higher-k dielectric polymer, when cast as a film, has a high surface energy. In terms of advancing water contact angle, the angle is for instance lower than 80 degrees, or lower than about 60 degrees, or lower than about 50 degrees.

In embodiments, the difference in magnitude of the dielectric constant of the higher-k dielectric material versus the lower-k dielectric material is at least about 0.5, or at least about 1.0, or at least about 2.0, for example from about 0.5 to about 200.

In embodiments, the present phase-separated dielectric structure contains intentionally created pores (also referred to as voids and apertures) such as those created using processes and materials similar to those described in for example Lopatin et al., U.S. Pat. No. 6,528,409; Foster et al., U.S. Pat. No. 6,706,464; and Carter et al., U.S. Pat. No. 5,883,219. In other embodiments, the present phase-separated dielectric structure does not contain such intentionally created pores (but pinholes may be present in certain embodiments which are not intentionally created but rather are an undesired byproduct of the present process). The pinhole density in embodiments is for example less than 50 per mm$^2$ (square millimeter), or less than 10 per mm$^2$, or less than 5 mm$^2$. In further embodiments, the present phase-separated dielectric structure is pinhole free. In embodiments, the dielectric composition is non-photoimageable. In embodiments, there is absent a step to create pores in the dielectric structure.

In embodiments, the dielectric structure has an overall dielectric constant of more than about 4.0, or more than about 5.0, particularly more than about 6.0. The overall dielectric constant can be characterized with a metal/dielectric structure/metal capacitor. Particularly for thin-film transistor applications, a high overall dielectric constant is desirable in embodiments, so that the device can be operated at a relatively low voltage.

A crosslinking agent is present in the dielectric composition. When the dielectric composition comprises two or more materials, such as a higher-k dielectric material and a lower-k dielectric material which can separate into two or more phases during curing, the crosslinking agent causes crosslinking to occur between the higher-k dielectric material and the lower-k dielectric material throughout the phases. Other materials can be added into the dielectric composition. Representative crosslinking agents include poly(melamine-co-formaldehyde) resin, oxazoline functional crosslinking agents, blocked polyisocyanates, certain diamine compounds, dithiol compounds, diisocyanates, and the like. A catalyst for crosslinking may also be included, such as for example toluenesulfonic acid.

An infrared absorber or infrared absorbing agent is also present. The term "infrared" refers to electromagnetic radiation having a wavelength of from about 700 nm to about 3000 nm. In embodiments, suitable infrared absorbing agents include "near infrared absorbing agents" having a wavelength from about 700 to 1400 nm, and "thermal infrared absorbing agents" having a wavelength from about 1400 nm to about 3000 nm. In particular embodiments, the infrared absorbing agent has an absorption maximum ($\lambda_{max}$) of from about 800 nm to about 1400 nm, including from about 800 nm to about 1200 nm. Generally, any suitable infrared absorbing agent can be used. Infrared absorbing agents are commercially available from many sources such as H. W. Sands Corp., American Dye Source Inc., Epolin Inc., and Nagase America Corp. Specific exemplary infrared absorbing agents include Epolight™ 1178 ($\lambda_{max}$=1073 nm, melting pt. 210-213° C., absorptivity 62 L/g·cm, tetrakis amminium structure, Epolin), Epolight™ 4113 ($\lambda_{max}$=833 nm, melting pt. 270-274° C., absorptivity 65 L/g·cm, contains platinum, Epolin), Epolight™ 5588 ($\lambda_{max}$=860 nm, absorptivity 240 L/g·cm, Epolin), ADS815EI ($\lambda_{max}$=815 nm, melting pt. >200° C., absorptivity 2.6×10$^5$ L/mol·cm, American Dye Source), SDA9393 ($\lambda_{max}$=798 nm, melting pt. 217-219° C., absorptivity 429 L/g·cm, H.W. Sands), SDA5688 ($\lambda_{max}$=842 nm, melting pt. 228-230° C., absorptivity 378 L/g·cm, H.W. Sands), NK-2911 (Nagase), and NK-4680 (believed to have $\lambda_{max}$=830 nm, cyanine dye, Nagase). The infrared absorbing agent may be present in the dielectric layer, or in the dielectric composition, in the amount of from about 0.001 wt % to about 5 wt %, including from about 0.1 to about 3 wt %, or from about 0.5 to about 2 wt %, or from about 0.5 to about 3 wt %, or from about 1 to about 2 wt %, by weight of the dielectric layer or of the dielectric composition without the liquid. In embodiments, the infrared absorbing agent can be a polymethine such as a cyanine, a squaraine, or a croconaine; a phthalocyanine, naphthalocyanine, quinone-diimmonium or aminium salt, or a dithiolene metal complex.

One, two or more suitable fluids can be used for the liquid (which facilitates the liquid depositing) or solvent which is used in the dielectric composition. In embodiments, the liquid/solvent is capable of dissolving the lower-k dielectric polymer and the higher-k dielectric polymer. Representative liquids include but are not limited to water; alcohols such as methanol, ethanol, propanol, butanol, pentanol, hexanol, ethylene glycol, dowanol, and methoxyethanol; acetates such as ethyl acetate and propylene glycol monoethyl ether acetate; ketones such as methyl isobutyl ketone, methyl isoamyl ketone, acetone, methyl ethyl ketone, and methyl propyl ketone; ethers such as petroleum ether, tetrahydrofuran, and methyl t-butyl ether; hydrocarbons such as hexane, cyclohexane, cyclopentane, hexadecane, and iso-octane; aromatic hydrocarbons such as toluene, xylene, ethyl benzene, and mesitylene; chlorinated solvents such as chloroform, dichloromethane, dichloroethane, chlorobenzene, dichlorobenzene, and trichlorobenzene; and other solvents such as dimethyl sulfoxide, trifluoroacetic acid, acetonitrile, dimethyl formamide, dimethyl acetamide, pyridine, and n-methyl-alpha-pyrrolidinone.

Inorganic nanoparticles may also be optionally included to boost the overall dielectric constant of the dielectric layer. These nanoparticles do not react with the dielectric polymers, and are generally dispersed throughout the dielectric layer. The nanoparticles have a particle size of from about 3 nm to about 500 nm, or from about 3 nm to about 100 nm. Any suitable inorganic nanoparticles can be used. Exemplary nanoparticles include metal nanoparticles such as Au, Ag, Cu, Cr, Ni, Pt and Pd; metal oxide nanoparticles such as $Al_2O_3$, $TiO_2$, $ZrO_2$, $La_2O_3$, $Y_2O_3$, $Ta_2O_5$, $ZrSiO_4$, SrO, SiO, $SiO_2$, MgO, CaO, $HfSiO_4$, $BaTiO_3$, and $HfO_2$; and other inorganic nanoparticles such as ZnS and $Si_3N_4$. The addition of inorganic nanoparticles has several advantages. First, the dielectric constant of the overall gate dielectric layer can be increased. Second, when metal nanoparticles are added, the particles can function as electron traps to lower gate leakage of the gate dielectric layer.

The concentration of each of the above listed components in the dielectric composition varies from about 0.001 to about 99 percent by weight of the composition. The concentration of the lower-k dielectric material is for example from about 0.1 to about 30 percent by weight, or from about 1 to about 20 percent by weight. The concentration of the higher-k dielectric material is for example from about 0.1 to about 50 percent by weight, or from about 5 to about 30 percent by weight. The concentration of crosslinking agent (and any catalyst for crosslinking reaction) will depend on the concentration of the dielectric polymers. The ratio of the crosslinking agent to the dielectric polymers is, for example, from about 1:99 to about 50:50, or from about 5:95 to about 30:70 by weight. The ratio of the catalyst to the dielectric polymers is for example from about 1:9999 to about 5:95, or from 1:999 to about 1:99 by weight. The inorganic nanoparticle can be for example from about 0.5 to about 30 percent by weight, or from about 1 to about 10 percent by weight.

In embodiments, the lower-k dielectric material and the higher-k dielectric material are not phase separated in the dielectric composition. The phrase "not phase separated" means that the lower-k dielectric material and the higher-k dielectric material are dissolved in the liquid. The term "dissolved" indicates total dissolution or partial dissolution of the lower-k dielectric material and the higher-k dielectric material in the liquid. The lower-k dielectric polymer, the higher-k dielectric polymer, and the liquid may be miscible to form a single phase over certain ranges of temperature, pressure, and composition. The temperature range is for example from 0 to 150° C., particularly at about room temperature. The pressure is generally about 1 atmosphere. In the dielectric composition prior to the liquid depositing, the lower-k dielectric material and the higher-k dielectric material can be present for example from about 0.1 to about 90 weight percent, or from about 0.5 to about 50 weight percent, based on the total weight of the lower-k dielectric polymer, the higher-k dielectric polymer, and the liquid. The ratio between the lower-k dielectric material to the higher-k dielectric material can be for example from about 1:99 to 99:1, or from about 5:95 to about 95:5, particularly from about 10:90 to about 40:60 (first recited value in each ratio represents the lower-k dielectric polymer).

In embodiments where the lower-k dielectric polymer, the higher-k dielectric material and the liquid are miscible to form a single phase (typically a clear solution) prior to the liquid depositing, the single phase can be confirmed by light scattering technique, or visually detected by human eyes without the assistance of any tools.

Prior to the liquid depositing, the dielectric composition may contain in embodiments aggregates of the lower-k dielectric material and/or higher-k dielectric polymer. These aggregates may be for example on a scale less than the wavelength of visible light, or less than 100 nm, particularly less than 50 nm. For purposes of the present disclosure, these aggregates, if present in the dielectric composition, are not considered the result of phase separation or phase-separated; moreover, these aggregates are not considered the "first phase" and/or the "second phase."

The dielectric composition is liquid deposited onto a substrate. Any suitable liquid depositing technique may be employed. In embodiments, the liquid depositing includes blanket coating such as spin coating, blade coating, rod coating, dip coating, and the like, and printing such as screen printing, ink jet printing, stamping, stencil printing, screen printing, gravure printing, flexography printing, and the like.

In embodiments, the liquid depositing can be accomplished in a single step. The term "single step" refers to liquid depositing both the first and the second dielectric materials at the same time from one dielectric composition. This is different from the process for fabricating a conventional dual-layer dielectric structure, wherein two different dielectric materials are liquid deposited separately from two different dielectric compositions. "Step" in "single step" is different from the term "pass". In embodiments, in order to increase thickness of the dielectric structure, more than 1 pass can be carried out during the single step deposition of the dielectric composition.

In fabricating the dielectric structure, the present process involves causing phase separation of the lower-k dielectric material and the higher-k dielectric material to form a dielectric structure comprising two phases. The term "causing" includes spontaneous occurrence of phase separation during liquid deposition when the liquid evaporates. The term "causing" also includes external assistance for facilitating the phase separation during and after the liquid deposition; in embodiments, phase separation is caused by for example thermal annealing and/or solvent annealing. Thermal annealing could be performed at any suitable temperature, for example at a temperature higher than the glass transition temperature or melting point of one of the dielectric polymers. The thermal annealing time, depending on the particular dielectric combination, can vary from about 1 minute to about 1 day, or from about 1 minute to 1 hour. Solvent annealing can be done at any temperature such as room temperature or an elevated temperature by exposing the deposited dielectric structure to the vapor of one or more solvents. Representative solvents can be selected, for instance, from the liquids described herein for the liquid depositing. The solvent annealing time, depending on the particular dielectric combination, could be from about a few seconds to about 1 week, or from about 1 minute to 2 hours.

The term "phase" in "first phase" and "second phase" means a domain or domains of material in which a property such as chemical composition is relatively uniform. Accordingly, the term "interphase" refers to an area between the first phase and the second phase in the phase-separated dielectric structure in which a gradient in composition exists. In embodiments, the dielectric structure comprises the sequence: the first phase, optional interphase, and the second phase.

In embodiments, the "phase-separated" nature of the present phase-separated dielectric structure is manifested by any of the following possible representative morphologies of the first phase and the second phase: (1) an interphase (in the form of a layer) present between the first phase (in the form of a layer) and the second phase (in the form of a layer); (2) one phase forms a plurality of "dots" in a continuous matrix of the other phase; (3) one phase forms a plurality of rod-shaped elements (e.g. cylinders) in a continuous matrix of the other phase; and (4) one phase is interpenetrating into the other phase to form bicontinuous domains. In embodiments, morphology (2), (3), or (4) may be present, but not (1).

The "phase-separated" nature of the present phase-separated dielectric structure regarding the morphology of the first phase and the second phase can be determined by various analyses such as for example the following: Scanning Electron Microscopy (SEM) and Atomic Force Microscopy (AFM) analysis of surface and cross-section of the dielectric structure; and Transmission Electron Microscopy (TEM) analysis of a cross-section of the dielectric structure. Other tools such as light scattering and X-ray (wide angle and small angle X-rays) scattering could also be used.

In embodiments, morphology (1) involving the interphase differs from a conventional dual-layer gate dielectric having an interfacial layer in that the interphase involves a gradient composition change; whereas the interfacial layer involves a discontinuous composition change, not a gradient composition change. In embodiments, another difference is that the present interphase is relatively thick, involving a thickness ranging from about 10 nm to about 50 nm, which typically is significantly larger than any interfacial layer found in a conventional dual-layer gate dielectric which may have a interfacial layer thickness of less than about 5 nm, particularly less than about 3 nm.

In embodiments, the lower-k dielectric material is a majority of the first phase, and the higher-k dielectric material is a majority of the second phase. Similarly, the higher-k dielectric material is a minority of the first phase, and the lower-k dielectric material is a minority of the second phase. The term "majority" means more than 50% by weight of the total weight of the lower-k dielectric material and the higher-k dielectric material in a phase of the phase-separated dielectric structure. The term "minority" means less than 50% by weight of the total weight of the lower-k dielectric material and the higher-k dielectric material in a phase of the phase-separated dielectric structure.

In embodiments, the lower-k dielectric material is in a higher concentration than the higher-k dielectric phase in a region of the dielectric structure closest to the semiconductor layer. Put another way, the first phase is closer to the semiconductor layer than the second phase.

The term "region" refers to a thin slice (parallel to the surface of the dielectric structure) of the phase-separated dielectric structure closest to the semiconductor layer. The region is examined to determine its concentration of the lower-k dielectric material and the higher-k dielectric polymer. In embodiments, the region contains a portion of or all of the first phase and optionally a portion of or all of the second phase. In embodiments, the optional interfacial layer may be present in the phase-separated dielectric structure and thus the region may include the interfacial layer as long as the region has a sufficient thickness to include a portion or all of the first phase and optionally a portion or all of the second phase. The region has any suitable thickness for use in an analytical technique such as for example from about 1 nm to about 100 nm, or from about 5 nm to about 100 nm, or particularly from about 5 nm to about 50 nm.

Various methods can be used to determine the concentration of the two dielectric polymers. For example, X-Ray Photoelectron Spectroscopy (XPS) can be used to analyze the concentration of each atom in the region. AFM could be used to determine domain size of different phases. TEM on a cross-section of the region could also be used to determine domain size of difference phases and concentration of each atom of different dielectric materials. In certain embodiments, the combination of different methods may be used. In case of significant variation in results from different methods, the results from TEM analysis is preferred.

In embodiments of the "region," the lower-k dielectric material is at a concentration for example ranging from about 60% to 100%, or from about 80% to 100%, and the higher-k dielectric material is at a concentration ranging from about 40% to 0%, or from about 20% to 0%. The concentration can be controlled by various factors such as the initial ratio of the lower-k dielectric material and the higher-k dielectric material in the dielectric composition, the concentration of the dielectric polymers in the dielectric composition, the miscibility of the dielectric polymers, the processing conditions such as the annealing time and annealing temperature.

In order to achieve phase separation, in embodiments, the lower-k dielectric material and higher-k dielectric material are intentionally chosen to be immiscible or partial miscible in solid state. The miscibility (capability of a mixture to form a single phase) of the two dielectric polymers can be predicted by looking at their interaction parameter, x. Generally speaking, a material is miscible with another material which is similar to it.

In embodiments where the phase-separated dielectric structure is layered (morphology (1)), the first phase has a thickness for example from about 1 nm to about 500 nm, or from about 5 nm to about 200 nm, or from about 5 nm to about 50 nm. The second phase has a thickness for example from about 5 nm to about 2 micrometer, or from about 10 nm to about 500 nm, or from about 100 nm to about 500 nm. The dielectric structure has an overall thickness for example from about 10 nm to about 2 micrometers, or from about 200 nm to about 1 micrometer, or from about 300 to about 800 nm.

In embodiments, the phase-separated dielectric structure comprises a material blend. In embodiments, the phase-separated material blend is a binary blend. In other embodiments, the phase-separated material blend is a ternary blend or a quaternary blend when a third or a fourth dielectric material is added respectively. As used herein, the term "blend" merely indicates the presence of two or more polymers and does not imply the concentration or distribution of the lower-k dielectric material and the high-k dielectric material in the first phase and the second phase. Further aspects of the present disclosure relate to a thin-film transistor comprising a phase-separated, material blend gate dielectric.

An optional interfacial layer may be present between the semiconductor layer and the phase-separated dielectric structure. The interfacial layer may be prepared using the materials and procedures disclosed in for example U.S. Pat. No. 7,282,735, the disclosure of which is totally incorporated herein by reference.

The dielectric composition of the present disclosure has several advantages. First, this composition avoids multiple-step deposition of different dielectric materials by using a single step feature. Second, the phase-separated material blend dielectric may offer better properties via the combination of advantages of different polymers.

Additional advantages accrue when the dielectric composition is used in conjunction with a selected substrate. For roll-to-roll manufacturing, the substrate must be structurally flexible. In embodiments, the substrate is plastic and is for example, poly(ethylene terephthalate) (PET). The thickness of the substrate may be from about 10 micrometers to about 10 millimeters, with an exemplary thickness being from about 50 to about 400 micrometers.

Normally, the dielectric composition is cured using a heat source, such as a hotplate or oven heating, to remove the liquid/solvent, and to cure the dielectric composition. However, referring to the Figures again, these heating methods typically heat all of the parts of the electronic device/transistor that are present on the substrate at the time the dielectric composition is applied. Due to the different construction of each part/layer, this application of heat can lead to deformation of, for example, the substrate. In addition, these methods are typically difficult to integrate with roll-to-roll processing, particularly for dielectric materials that require a relatively long curing time, such as 10 minutes or more. Thus, reducing the curing time is desirable. It is also desirable to reduce the processing temperature experienced by the substrate to avoid deformation of the substrate. Generally, the curing time can be shortened by increasing the curing temperature.

The inclusion of the infrared absorbing agent in the dielectric composition permits both a lowering of the curing time and a reduction in the processing temperature experienced by the substrate. In this regard, PET is a poor absorber of infrared radiation. Means of delivering infrared radiation, such as by a laser or an infrared lamp, that are also compatible with roll-to-roll manufacturing can then be used to expose the dielectric composition to infrared radiation. The dielectric composition can then be selectively heated compared to the substrate. Thus, the substrate temperature can be kept relatively low, while the temperature of the dielectric composition can be high enough to cure the composition and form the dielectric layer. In embodiments, the dielectric composition is exposed to infrared radiation for a period of from about 1 second to about 30 minutes, including from about 30 seconds to about 10 minutes, or from about 1 minute to about 5 minutes. In other embodiments, the irradiation time is from about 1 microsecond to about 1 second, including from about 10 microseconds to about 500 milliseconds.

In embodiments, a pulse laser is used to expose the dielectric composition to infrared radiation. Controlling the length of the pulse and the frequency of the radiation allows the dielectric composition to be selectively heated as desired. Particularly for a short pulse laser with high energy output, for example, when the dielectric composition is irradiated for a short time such as microseconds to about milliseconds, the heat generated in the dielectric composition will be sufficient enough to crosslink the dielectric composition, but the heat will not be able to diffuse to the substrate, or will only diffuse into a small portion of the substrate (e.g. a region that is less than 10% of the thickness of the substrate) within the short irradiation period. This lack of heat diffusion allows the substrate to maintain its dimensional stability.

While it is best if the laser emits at a wavelength equal to the $\lambda_{max}$ of the infrared absorbing agent, in practice it is acceptable for the laser to emit at a wavelength within the absorption peak of the infrared absorbing agent. Preferably, the laser emits at a wavelength where the infrared absorbing agent attains an absorption efficiency that is at least 5% of the maximum absorption efficiency, and preferably the laser emits at a wavelength where the infrared absorbing agent attains 20% of its maximum absorption efficiency. In other embodiments, other pulse irradiation tools such as Pulse-Forge® Tools from Novacentrix can be used.

In particular, the dielectric composition of the present disclosure, which comprises an infrared absorbing agent, enables the final dielectric layer to be patterned by infrared laser irradiation. The laser can be focused to a desired size and can scan the deposited dielectric composition according to a desired final pattern design. Irradiated areas are crosslinked, while non-irradiated areas are not. The non-irradiated dielectric composition can be removed by certain solvents to form a patterned dielectric structure on the substrate, such as a dielectric layer with via holes.

If desired, the dielectric composition can also be heated with another heat source besides the infrared radiation. For example, a hotplate or oven heating can be used to elevate the temperature of both the substrate and the dielectric composition to a first elevated temperature, with the infrared radiation elevating only the dielectric composition to a second elevated temperature. The second elevated temperature is, for example, at least 20° C. higher than the first elevated temperature, including at least 40° C. higher than the first elevated temperature.

During the curing of the dielectric composition, the substrate attains a lower temperature than the dielectric composition. In particular embodiments, the substrate attains a temperature of from about room temperature to about 160° C., including from about room temperature to about 120° C., or from about room temperature to about 100° C. The dielectric composition temperature, on the other hand, can be for example from about 100° C. to about 300° C., or from about 120° C. to about 180° C., or from about 160° C. to about 200° C. The difference between the temperature of the dielectric composition and the temperature of the substrate is at least 20° C., including at least 40° C.

Infrared curing is also compatible with organic semiconductors, which are typically conjugated polymers/molecules such as polythiophenes. Such organic semiconductors are more resilient to infrared radiation because they have low or no absorbance at infrared wavelengths. However, organic semiconductors have high absorbance at ultraviolet (UV) wavelengths, so curing the dielectric layer using UV wavelengths is contraindicated.

In specific embodiments, the dielectric layer is formed from a dielectric composition comprising poly(methyl silsesquioxane), poly(4-vinyl phenol), a crosslinking agent, and an infrared absorbing agent. This dielectric composition is deposited on a PET substrate.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAGT™, available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor Layer

Materials suitable for use as the organic semiconductor layer include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. Pat. Nos. 6,621,099, 6,774,393, 6,770,904, and 6,949,762, the disclosures of which are incorporated herein by reference in their entireties. Additionally, suitable materials include the semiconductor polymers disclosed in "Organic Thin-film transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The composition and formation of the gate dielectric are described herein. In embodiments, the dielectric is a highly crosslinked and robust layer comprising an infrared absorbing agent. In some embodiments, the dielectric is a homogeneous layer without phase separation. In other embodiments, the dielectric is a phase-separated gate dielectric, and the first phase and the second phase of the gate dielectric contact each other. In other embodiments, an interphase is present between the first phase and the second phase. In embodiments, the first phase of the gate dielectric contacts the semiconductor layer; in other embodiments, an interfacial layer is present between the first phase and the semiconductor layer. In embodiments, both the first phase and the second phase of the gate dielectric contact the semiconductor layer. In other embodiments, both the first phase and the second phase of the gate dielectric contact the semiconductor layer, wherein the contact area between the semiconductor layer and the first phase is larger than that between the semiconductor layer and the second phase in the channel region (the region between the source and drain electrodes) of the thin-film transistor.

The gate dielectric, the gate electrode, the semiconductor layer, the source electrode, and the drain electrode are formed in any sequence on the substrate. In embodiments, the gate electrode and the semiconductor layer are on opposite sides of the gate dielectric layer, and the source electrode and the drain electrode are both in contact with the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference. The term "on the substrate" refers to the various layers and components with reference to the substrate as being the bottom or support for the layers and components which are on top of it. In other words, all of the components are on the substrate, even though they do not all directly contact the substrate. For example, both the dielectric layer and the semiconductor layer are on the substrate, even though one layer is closer to the substrate than the other layer.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

A substrate made of PET and having a thickness of 3 mils (0.003 inches, 76.2 microns) was provided. A thin layer of aluminum functioned as the gate electrode.

A dielectric composition was prepared that contained poly (methyl silsesquioxane), poly(4-vinyl phenol), a crosslinking agent, an infrared absorbing agent, and a solvent. 0.08 grams poly(4-vinyl phenol) (Aldrich, Mw=25000) was dissolved in 1.0 grams n-butanol. 0.08 grams methylated melamine-formaldehyde resin (Aldrich, 84 wt % in n-butanol) and 0.12 g poly(methyl silsesquioxane) (26 wt % in n-butanol) were added to the mixture. 0.003 grams infrared absorbing agent (ADS815EI, American Dye Source, Inc.) was also added. After filtering through a 0.2 μm syringe filter, the dielectric composition was spin coated onto the substrate at 2000 rpm for 60 seconds. The deposited dielectric composition was put on top of a hotplate at 80° C. and irradiated with an infrared lamp on top for 5 minutes to form a dielectric layer. It was found that the dielectric layer was completely crosslinked to form a robust layer, with no deformation observed in the PET substrate.

A transistor was completed by spin coating a semiconductor layer of PQT-12 (a polythiophene) and vacuum evaporation of gold to form source and drain electrodes. The transistor was characterized with a Keithley 4200 SCS under ambient conditions. Mobility of 0.07 $cm^2/V \cdot sec$ and on/off ratio of $10^5$ were measured. The results showed that the presence of the infrared absorbing agent in the dielectric layer and the dual heating did not affect the overall electrical performance of the transistor.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. An electronic device comprising a dielectric layer, the dielectric layer comprising a crosslinked dielectric material and an infrared absorbing agent,
   wherein the dielectric material comprises a lower-k dielectric polymer and a higher-k dielectric polymer, and
   wherein the dielectric composition further comprises a liquid in which both the lower-k dielectric polymer and the higher-k dielectric polymer are miscible, and
   wherein the infrared absorbing agent is a polymethine, phthalocyanine, naphthalocyanine, aminium salt, or a dithiolene metal complex.

2. A dielectric composition comprising a dielectric material, a crosslinking agent, and an infrared absorbing agent,
   wherein the dielectric material comprises a lower-k dielectric polymer and a hiqher-k dielectric polymer, and
   wherein the dielectric composition further comprises a liquid in which both the lower-k dielectric polymer and the hiqher-k dielectric polymer are miscible, and
   wherein the infrared absorbing agent is a polymethine, phthalocyanine, naphthalocyanine, aminium salt, or a dithiolene metal complex.

3. The dielectric composition of claim 2, wherein the lower-k dielectric polymer is poly(methyl silsesquioxane), and the higher-k dielectric polymer is poly(4-vinyl phenol).

4. The dielectric composition of claim 2, wherein the infrared absorbing agent has an absorption maximum of from about 800 nm to about 1400 nm, and wherein the infrared absorbing agent is present in the amount of from about 0.001 to about 5 wt %, based on the weight of the dielectric composition.

* * * * *